United States Patent
Nishiyama

(10) Patent No.: US 7,024,004 B2
(45) Date of Patent: Apr. 4, 2006

(54) AUDIO CIRCUIT HAVING NOISE CANCELLING FUNCTION

(75) Inventor: Haruyasu Nishiyama, Hyogo (JP)

(73) Assignee: Fujitsu Limited, Kawasaki (JP)

( * ) Notice: Subject to any disclaimer, the term of this patent is extended or adjusted under 35 U.S.C. 154(b) by 515 days.

(21) Appl. No.: 10/193,424

(22) Filed: Jul. 11, 2002

(65) Prior Publication Data

US 2003/0161488 A1 Aug. 28, 2003

(30) Foreign Application Priority Data

Feb. 25, 2002 (JP) .............................. 2002-047330

(51) Int. Cl.
*H04B 15/00* (2006.01)
*A61F 11/06* (2006.01)

(52) U.S. Cl. .................... 381/94.5; 381/94.1; 381/71.1

(58) Field of Classification Search ............... 381/94.1, 381/94.5, 56–59, 71.1, 71.3; 700/94; 455/218, 455/296, 222–223, 212; 330/51; 379/390.01, 379/392.01

See application file for complete search history.

(56) References Cited

U.S. PATENT DOCUMENTS 5,727,072 A * 3/1998 Raman ...................... 381/94.2

FOREIGN PATENT DOCUMENTS

JP 02-279026 11/1990

* cited by examiner

*Primary Examiner*—Laura A. Grier
(74) *Attorney, Agent, or Firm*—Greer, Burns & Crain, Ltd.

(57) ABSTRACT

An audio circuit has an function of removing noise signals before sending audio signals to a sounder. The circuit includes a mute detector for detecting a mute portion of the audio signals, an audio signal amplifier for amplifying the audio signals, and a noise canceler for canceling noise signals mixing with the audio signals by utilizing the noise signals picked up by the mute detector in the mute portion of the audio signals.

7 Claims, 3 Drawing Sheets

Invention & Prior Art

AUDIO CIRCUIT HAVING NOISE CANCELLING FUNCTION

BACKGROUND OF THE INVENTION

1. Field of the Invention

The present invention relates to an audio circuit for outputting sounds to the outside through a speaker for example.

2. Description of the Related Art

Recent personal computers are often provided with a display unit made of a liquid crystal panel. FIG. 2 illustrates a display unit of a typical desktop personal computer. The illustrated display unit 2 includes a liquid crystal display 3 arranged centrally at the front portion of the display unit 2. The display 3 is flanked by a pair of speakers 4a, 4b for outputting sounds to the outside. Generally, the speakers 4a, 4b are connected to an audio circuit (not apparent in FIG. 2) built in a housing of the display unit 2. The audio circuit feeds audio signals to the speakers 4a, 4b. Recently, the audio circuit generally utilizes a Hi-Fi system for providing high-fidelity sound to promote the so-called audio-visualization in the personal computers.

The liquid crystal display 3 generally utilizes a cold cathode ray tube as a back light source driven by an inverter. In controlling the lighting of the cold cathode ray tube by the inverter, pulse signals having a predetermined duty cycle are fed to the cold cathode ray tube. The brightness of the liquid crystal display 3 is adjusted by varying the duty cycle of the pulse signals.

As shown in FIG. 3, the audio circuit 1 includes a signal input 11 for inputting audio signals to a signal amplifier 12 for amplifying the audio signals. The signal amplifier 12 is connected to the speakers 4a, 4b. The signal amplifier 12 is connected to a ground line 6 to which an inverter 5 of the display unit 2 is connected.

In controlling the lighting of the cold cathode ray tube at the inverter 5, current fluctuates with an amplitude of about 1–2A in response to the pulse signals. Such current fluctuation causes noises to be fed to the signal amplifier 12 through the ground line 6. Therefore, noise-laden audio signals are outputted to the speakers 4a, 4b, which makes the listener feel unpleasant.

SUMMARY OF THE INVENTION

It is, therefore, an object of the present invention to provide an audio circuit capable of outputting high quality sound by eliminating noise signals.

Another object of the present invention is to provide an audio-visual apparatus, typically a computer system, which incorporates such an audio circuit.

According to a first aspect of the present invention, there is provided an audio circuit for outputting audio signals to a sounder. The audio circuit comprises a mute detector for detecting a mute portion of the audio signals, an audio signal amplifier for amplifying the audio signals, and a noise canceler for canceling noise signals mixing with the audio signals by utilizing the noise signals picked up by the mute detector in the mute portion of the audio signals.

Preferably, the noise signals are mixed with the audio signals from another electric circuit connected to the audio signal amplifier through a common ground line.

Preferably, the noise canceler comprises a noise detector connected to said another electric circuit through the ground line for detecting non-mixing noise signals from said another electric circuit, and the noise canceler combines the non-mixing noise signals with the noise-laden audio signals for canceling the mixing noise signals by the non-mixing noise signals.

Preferably, the noise canceler further comprises a noise amplifier for amplifying the non-mixing noise signals in accordance with a level of the mixing noise signals detected by the mute detector in the mute portion of the audio signals and for inverting a phase of the amplified non-mixing noise signals.

Preferably, the noise canceler further comprises an adder for adding the phase-inverted non-mixing noise signals from the noise amplifier and the noise-laden audio signals from the signal amplifier.

According to a second aspect of the present invention, there is provided an audio-visual apparatus which comprises an audio source for supplying audio signals, an audio signal amplifier connected to the audio source for amplifying the audio signals, a sounder connected to the audio signal amplifier for generating sounds in response to the audio signals, and a display connected to the audio signal amplifier through a common ground line, wherein noise signals from the display mixes with the audio signals through the ground line. The apparatus further comprises a mute detector connected to the audio source and the sounder for detecting a mute portion of the audio signals, and a noise canceler for canceling the mixing noise signals by utilizing the noise signals picked up by the mute detector in the mute portion of the audio signals.

Preferably, the noise canceler comprises a noise detector connected to the display through the ground line for detecting non-mixing noise signals from the display, and the noise canceler combines the non-mixing noise signals with the noise-laden audio signals for canceling the mixing noise signals by the non-mixing noise signals.

Preferably, the noise canceler further comprises a noise amplifier for amplifying the non-mixing noise signals in accordance with a level of the mixing noise signals detected by the mute detector in the mute portion of the audio signals and for inverting a phase of the amplified non-mixing noise signals.

Preferably, the noise canceler further comprises an adder for adding the phase-inverted non-mixing noise signals from the noise amplifier and the noise-laden audio signals from the signal amplifier.

Other features and advantages of the present invention will become clearer from the detailed description given below with reference to the accompanying drawings.

DETAILED DESCRIPTION OF THE PREFERRED EMBODIMENT

Figure 1:
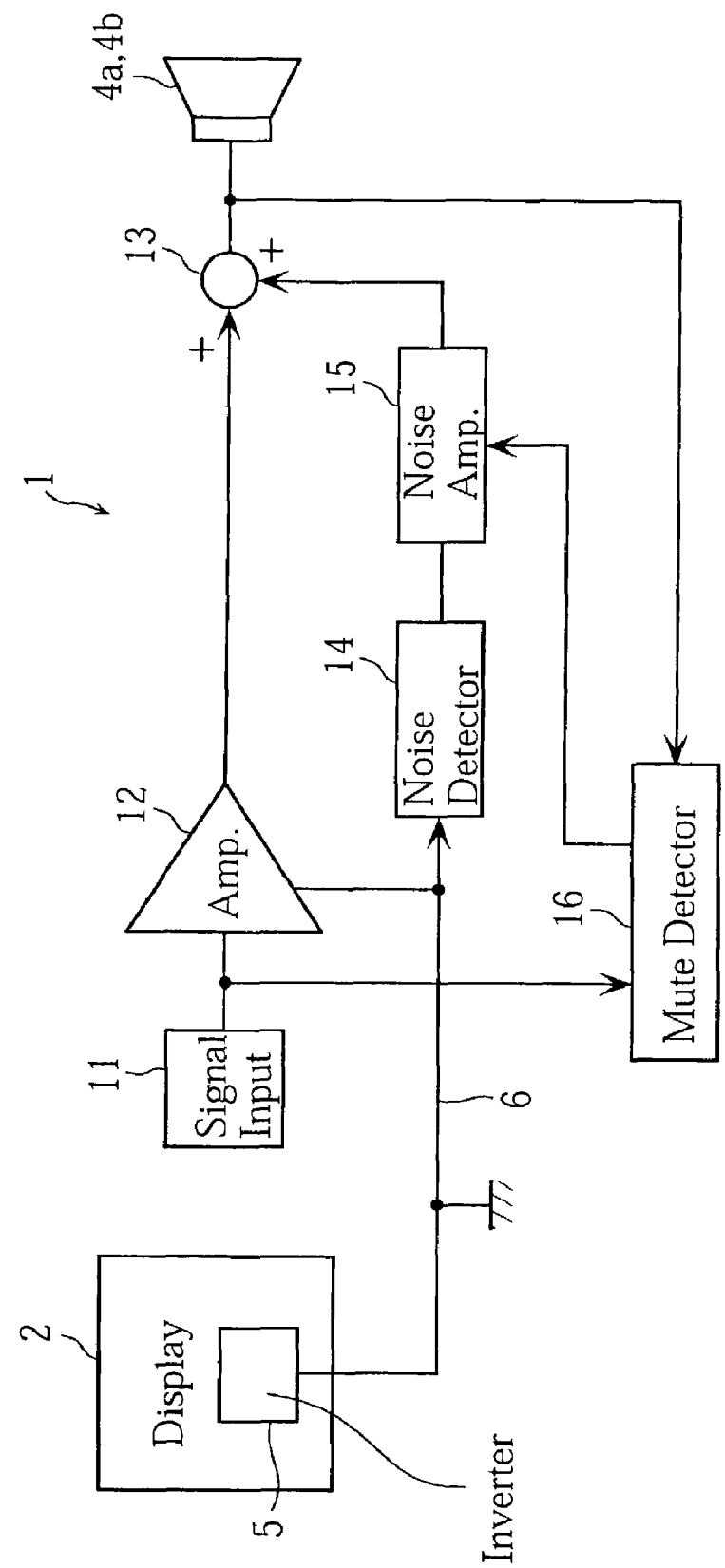
FIG. 1 is a block diagram showing an audio circuit and its peripheral circuit embodying the present invention.
Figure 2:
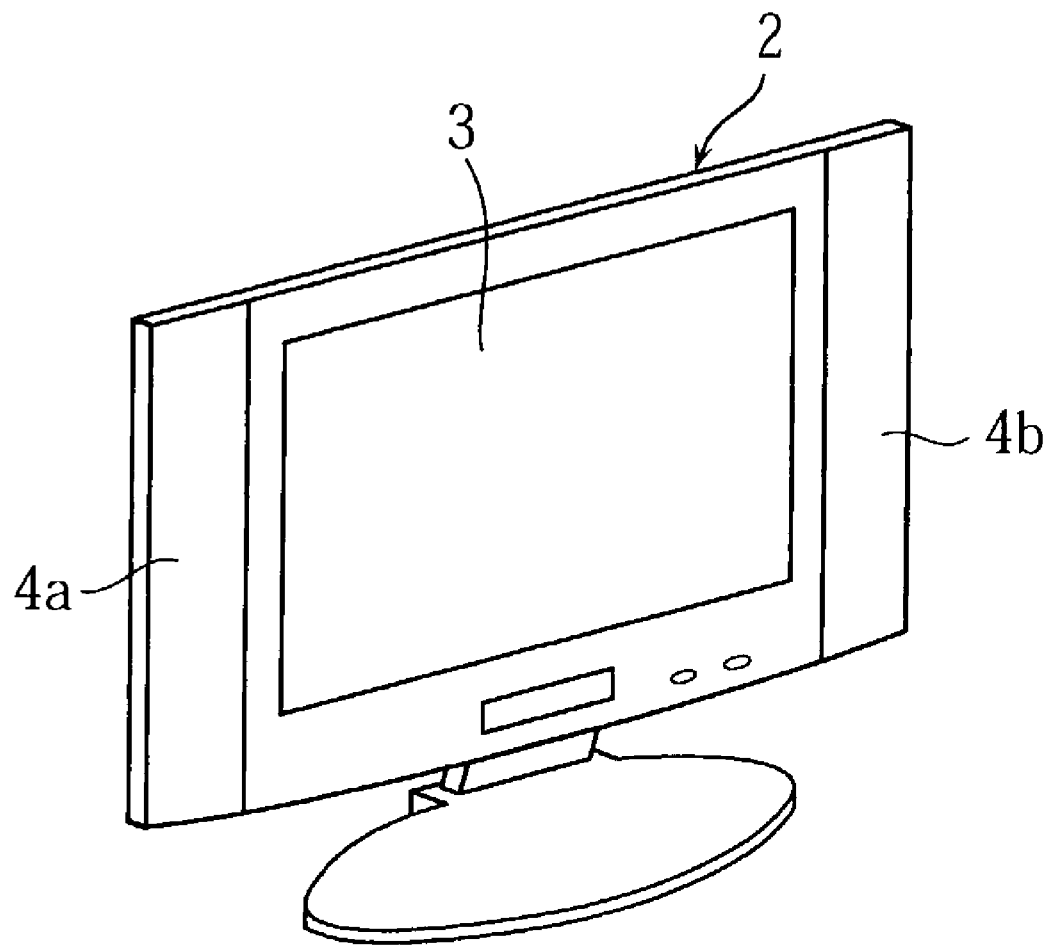
FIG. 2 is a perspective view showing a typical display unit.
Figure 3:
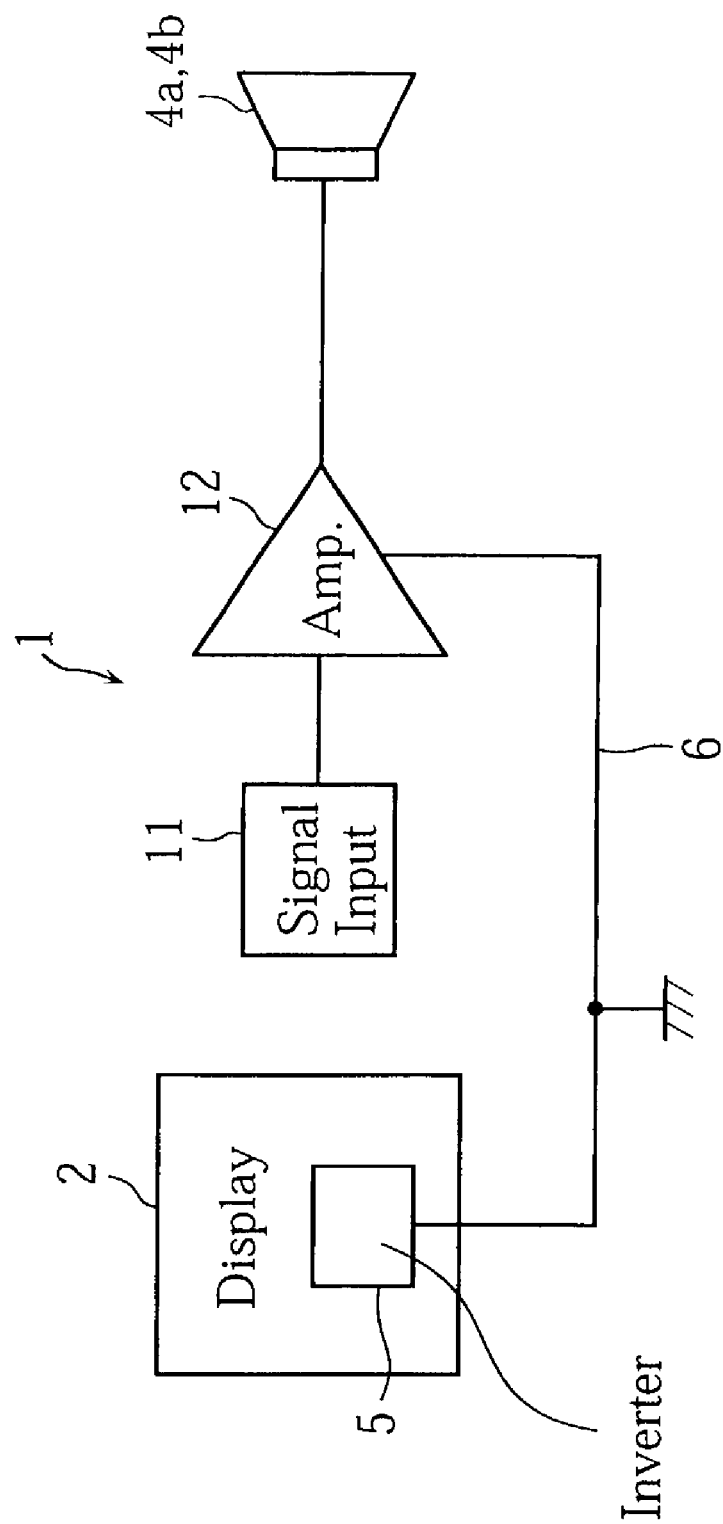
FIG. 3 is a block diagram showing a prior art audio circuit and its peripheral circuit.

FIG. 1 is a schematic block diagram of an audio circuit and its peripheral circuit embodying the present invention. The audio circuit 1 may be incorporated in a display unit 2 of a personal computer, as shown in FIG. 2. The display unit 2 is provided with a liquid crystal display 3 at the front portion thereof. The display 3 is flanked by a pair of speakers 4a, 4b. In this embodiment, each of the speakers 4a, 4b is a so-called slim speaker having a vertically elongated configuration. The speakers 4a, 4b include a diaphragm, a voice coil and a magnet unit (not shown).

The liquid crystal display 3 is a back light type display which comprises a light source (not shown) such as a cold cathode ray tube. The display unit 2 includes an inverter 5 for driving the cold cathode ray tube by an inverter system. The inverter is connected to a ground line 6 to which the audio circuit 1 is also connected.

The audio circuit 1 includes a signal input 11 for inputting audio signals, an audio signal amplifier 12 connected to the signal input 11 for amplifying the audio signals, and a signal adder 13 connected to the audio signal amplifier 12. The audio circuit 1 further includes a noise detector 14 connected to the ground line 6 for detecting noise signals passing through the ground line 6, a noise amplifier 15 for amplifying the noise signals detected by the noise detector 14 for output to the signal adder 13. The audio circuit 1 further includes a mute detector 16 connected to the output side of the signal input 11 and to the output side of the signal adder 13 for detecting mute portions included in the audio signals.

The signal input 11 may comprise a connector for example. Audio signals generated in the main unit of e.g. a personal computer (not shown) are inputted to the signal input 11. The audio signals include not only musical signals but also voice signals.

The audio signal amplifier 12, which may include peripheral devices in addition to the main amplifying unit, amplifies the audio signals inputted through the signal input 11 with an appropriate gain.

The noise detector 14 is connected to the ground line 6 to detect the noise signals generated at the inverter 5 and passing through the ground line 6.

The noise amplifier 15 amplifies the noise signals detected by the noise detector 14 with the gain determined by the mute detector 16. The noise amplifier 15 also functions to invert the phase of the noise signals (180° phase shift) before the signals are fed to the signal adder 13.

The signal adder 13 adds the audio signals outputted from the audio signal amplifier 12 and the noise signals outputted from the noise amplifier 15. The output from the signal adder 13 is fed to the speakers 4a, 4b.

The mute detector 16 detects mute portions in the audio signals inputted through the signal input 11. Thus, the mute detector 16 determines the level of the noise signals mixed in the mute portions of the audio signals amplified by the audio signal amplifier 12. The level of the actual audio signals in the mute portions is almost zero, and only the noise signals prevail in the mute portions for allowing easy determination of the noise levels. The mute detector 16 sets, based on the level of the noise signals thus determined, a gain for amplification of the noise signals and supplies the gain setting to the noise amplifier 15. The noise signals are cancelled in the manner as described hereinafter.

The operation of the audio circuit 1 according to the present invention will be described below in detail.

First, audio signals for music for example are inputted through the signal input 11 to the signal amplifier 12 for amplification with a predetermined gain. Meanwhile, noise signals generated at the inverter 5 of the display unit 2 are also inputted to the signal amplifier 12 through the ground line 6. Thus, the noise signals are mixed with the audio signals at the signal amplifier 12 and amplified together with the audio signals. On the other hand, the noise signals passing through the ground line 6 are detected by the noise detector 14.

The mute detector 16 detects a mute portion included in the audio signals inputted through the signal input 11. The mute portion may be an intermission between different pieces of music or during a single piece of music for example.

The audio signals mixed with the noise signals at the signal amplifier 12 are inputted via the signal adder 13 to the mute detector 16. While the mute detector 16 is detecting a mute portion in which the noise signals prevail, it picks up only the amplified noise signals to determine the gain level for the mixing noise signal amplification.

Based on the determined level of the mixing noise signals, the mute detector 16 determines an appropriate gain level for the non-mixing noise signals detected by the noise detector 14 and feeds a gain setting signal to the noise amplifier 15.

Based on the gain setting signal, the noise amplifier 15 adjusts the gain level of the non-mixing noise signals detected by the noise detector 14 so that the level of the non-mixing noise signals provided by the noise amplifier 15 coincides with the level of the mixing noise signals provided by the signal amplifier 12. The noise amplifier 15 also inverts the phase of the non-mixing noise signals.

Subsequently, the non-mixing noise signals whose phase is inverted are fed to the signal adder 13 for adding to the audio-noise signal mixture amplified by the signal amplifier 12. As a result, the mixing noise signals contained in the audio signals are cancelled by the phase-inverted non-mixing noise signals. Therefore, the audio signals containing no noise signals are outputted to the speakers 4a, 4b.

In this way, with the audio circuit 1 according to the present invention, the level of the noise signals mixing with the audio signals is measured when the mute detector 16 detects a mute portion in the audio signals. Then, the non-mixing noise signals having been inverted in phase and amplified to the same extent as the mixing noise signals are added to the mixing noise signals for cancellation. Therefore, the audio circuit 1 according to the present invention can output audio signals which contain no noise signals and therefore have a high quality.

The present invention is not limited to the above-described embodiment. For example, the audio circuit 1 of the present invention may be used for any apparatus in which noises are transmitted through a ground line.

The invention claimed is:

1. An audio circuit for outputting audio signals to a sounder, comprising:
   a mute detector for detecting a mute portion of the audio signals;
   an audio signal amplifier for amplifying the audio signals; and
   a noise canceler for canceling noise signals mixing with the audio signals by utilizing the noise signals picked up by the mute detector in the mute portion of the audio signals;
   wherein the noise signals are mixed with the audio signals from another electric circuit connected to the audio signal amplifier through a common ground line.

2. The audio circuit according to claim 1, wherein the noise canceler comprises a noise detector connected to said another electric circuit through the ground line for detecting non-mixing noise signals from said another electric circuit, the noise canceler combining the non-mixing noise signals with the audio signals for canceling the mixing noise signals by the non-mixing noise signals.

3. The audio circuit according to claim 2, wherein the noise canceler further comprises a noise amplifier for amplifying the non-mixing noise signals in accordance with a level of the mixing noise signals detected by the mute detector in the mute portion of the audio signals and for inverting a phase of the amplified non-mixing noise signals.

4. The audio circuit according to claim 3, wherein the noise canceler further comprises an adder for adding the phase-inverted non-mixing noise signals from the noise amplifier and the audio signals from the signal amplifier.

5. An audio-visual apparatus comprising:
an audio source for supplying audio signals;
an audio signal amplifier connected to the audio source for amplifying the audio signals;
a sounder connected to the audio signal amplifier for generating sounds in response to the audio signals;
a display connected to the audio signal amplifier through a common ground line, noise signals from the display mixing with the audio signals through the ground line;
a mute detector connected to the audio source and the sounder for detecting a mute portion of the audio signals; and
a noise canceler for canceling the mixing noise signals by utilizing noise signals picked up by the mute detector in the mute portion of the audio signals;
wherein the noise canceler comprises a noise detector connected to the display through the ground line for detecting non-mixing noise signals from the display, the noise canceler combining the non-mixing noise signals with the audio signals for canceling the mixing noise signals by the non-mixing noise signals.

6. The audio-visual apparatus according to claim 5, wherein the noise canceler further comprises a noise amplifier for amplifying the non-mixing noise signals in accordance with a level of the mixing noise signals detected by the mute detector in the mute portion of the audio signals and for inverting a phase of the amplified non-mixing noise signals.

7. The audio-visual apparatus according to claim 6, wherein the noise canceler further comprises an adder for adding the phase-inverted non-mixing noise signals from the noise amplifier and the audio signals from the signal amplifier.

* * * * *